US012568717B2

(12) United States Patent
Ali et al.

(10) Patent No.: US 12,568,717 B2
(45) Date of Patent: Mar. 3, 2026

(54) RED LED AND METHOD OF MANUFACTURE

(71) Applicant: PORO TECHNOLOGIES LTD, Cambridge (GB)

(72) Inventors: Muhammad Ali, Cambridge (GB); Yingjun Liu, Cambridge (GB); Tongtong Zhu, Cambridge (GB)

(73) Assignee: PORO TECHNOLOGIES LTD, Cambridge (GB)

( * ) Notice: Subject to any disclaimer, the term of this patent is extended or adjusted under 35 U.S.C. 154(b) by 866 days.

(21) Appl. No.: 17/759,252

(22) PCT Filed: Jan. 22, 2021

(86) PCT No.: PCT/GB2021/050152
§ 371 (c)(1),
(2) Date: Jul. 21, 2022

(87) PCT Pub. No.: WO2021/148808
PCT Pub. Date: Jul. 29, 2021

(65) Prior Publication Data
US 2023/0053144 A1 Feb. 16, 2023

(30) Foreign Application Priority Data

Jan. 22, 2020 (GB) ...................................... 2000951
Apr. 20, 2020 (GB) ...................................... 2005730
(Continued)

(51) Int. Cl.
*H10H 20/817* (2025.01)
*H10H 20/01* (2025.01)
(Continued)

(52) U.S. Cl.
CPC .... *H10H 20/817* (2025.01); *H10H 20/01335* (2025.01); *H10H 20/81* (2025.01);
(Continued)

(58) Field of Classification Search
CPC ........................ H10H 20/817; H10H 20/01335
See application file for complete search history.

(56) References Cited

U.S. PATENT DOCUMENTS 8,436,334 B2 5/2013 Soh et al.
9,484,492 B2 11/2016 Bour et al.
(Continued)

FOREIGN PATENT DOCUMENTS

CN 107946417 A 4/2018
CN 108520911 9/2018
(Continued)

OTHER PUBLICATIONS

Dussaigne et. al. (2020). Full InGaN red light emitting diodes. Journal of Applied Physics. 128. 135704. 10.1063/5.0016217. (Year: 2020).*
(Continued)

*Primary Examiner* — Alia Sabur
(74) *Attorney, Agent, or Firm* — Merchant & Gould P.C.

(57) ABSTRACT

A red-light emitting diode (LED) comprises: an n-doped portion; a p-doped portion; and a light emitting region located between the n-doped portion and a p-doped portion. The light emitting region comprises: a light-emitting indium gallium nitride layer which emits light at a peak wavelength between 600 and 750 nm under electrical bias thereacross; a III-nitride layer located on the light-emitting indium gallium nitride layer; and a III-nitride barrier layer located on the III-nitride layer, and the light emitting diode comprises a porous region of III-nitride material. A red mini
(Continued)

| -7- | -7- | -7- |
| -6- | -6- | -6- |
| -5- | -5- | -5- |
| -4- | -4- | -4- |
| -3- | -3- | -3- |
| -2- | -2- | -2- |

| -1- |

| Porous layer |

| Substrate |

LED, a red micro-LED, an array of micro-LEDs, and a method of manufacturing a red LED are also provided.

20 Claims, 9 Drawing Sheets

(30)         Foreign Application Priority Data

| | | | |
|---|---|---|---|
| Aug. 4, 2020 | (GB) | ...................................... | 2012098 |
| Aug. 4, 2020 | (GB) | ...................................... | 2012103 |
| Aug. 4, 2020 | (GB) | ...................................... | 2012108 |
| Aug. 4, 2020 | (GB) | ...................................... | 2012110 |
| Nov. 16, 2020 | (GB) | ...................................... | 2018016 |

(51) Int. Cl.

| | |
|---|---|
| *H10H 20/81* | (2025.01) |
| *H10H 20/812* | (2025.01) |
| *H10H 20/814* | (2025.01) |
| *H10H 20/816* | (2025.01) |
| *H10H 20/825* | (2025.01) |

(52) U.S. Cl.
CPC ........ *H10H 20/812* (2025.01); *H10H 20/814* (2025.01); *H10H 20/8162* (2025.01); *H10H 20/825* (2025.01)

(56)         References Cited

U.S. PATENT DOCUMENTS

| | | | |
|---|---|---|---|
| 10,361,341 B2 | 7/2019 | Danesh et al. | |
| 2009/0001416 A1* | 1/2009 | Chua ................... | H01L 21/0262 |
| | | | 257/190 |
| 2009/0140274 A1* | 6/2009 | Wierer, Jr. .......... | H10H 20/018 |
| | | | 257/97 |
| 2010/0140629 A1 | 6/2010 | Lee et al. | |
| 2011/0193059 A1 | 8/2011 | Weirer, Jr. | |
| 2013/0011656 A1* | 1/2013 | Zhang ................. | H01L 21/0262 |
| | | | 205/684 |
| 2013/0146842 A1 | 6/2013 | Kim | |
| 2015/0041755 A1 | 2/2015 | Zhang | |
| 2017/0237234 A1 | 8/2017 | Han et al. | |
| 2018/0374988 A1 | 12/2018 | Mi | |
| 2019/0123235 A1 | 4/2019 | Cho et al. | |
| 2020/0227255 A1 | 7/2020 | Zhu et al. | |

FOREIGN PATENT DOCUMENTS

| | | |
|---|---|---|
| CN | 110034216 | 7/2019 |
| EP | 0584777 | 3/1994 |
| JP | 2001060719 | 3/2001 |
| JP | 2007-27298 A | 2/2007 |
| JP | 2007142426 | 6/2007 |
| JP | 2007-173316 A | 7/2007 |
| JP | 2007-537600 A | 12/2007 |
| JP | 2009-21361 A | 1/2009 |
| JP | 2011-501408 A | 1/2011 |
| JP | 2012-038824 A | 2/2012 |
| JP | 2014045015 | 3/2014 |
| JP | 2014-127708 A | 7/2014 |
| JP | 2014187159 | 10/2014 |
| JP | 2018-505567 A | 2/2018 |
| JP | 2018-533847 A | 11/2018 |
| JP | 2019-036719 A | 3/2019 |
| KR | 20190061088 | 6/2019 |
| TW | 201208112 | 2/2012 |
| WO | 2005/112123 A2 | 11/2005 |
| WO | 2009/038324 A2 | 3/2009 |
| WO | 2013/140320 A1 | 9/2013 |
| WO | 2018/080860 | 5/2018 |
| WO | 2019/027820 | 2/2019 |
| WO | 2019/063957 | 4/2019 |
| WO | 2019/145728 | 8/2019 |

OTHER PUBLICATIONS

Pasayat, Shubhra & Gupta, Chirag & Wang, Yifan & Denbaars, Steven & Nakamura, Shuji & Keller, Stacia & Mishra, Umesh. (2020). Compliant Micron-Sized Patterned InGaN Pseudo-Substrates Utilizing Porous GaN. Materials. 13. 213. 10.3390/ma13010213. (Year: 2020).*

International Search Report and Written Opinion of PCT/GB2021/050152, Apr. 15, 2021, 12 pages.

International Search Report and Written Opinion for PCT/GB2021/050147 (Apr. 9, 2021).

International Search Report and Written Opinion for No. PCT/GB2021/050158 (Apr. 15, 2021).

Office Action for Japanese Patent Application No. 2022-544132 (Aug. 13, 2024).

Office Action for Japanese Patent Application No. 2022-544134 (Aug. 5, 2024).

International Preliminary Report on Patentability of PCT/GB2021/050152, Jul. 26, 2022, 7 pages.

Alhassan, Abdullah I. et al., "High luminous efficacy green light-emitting diodes with AlGaN cap layer", Optics Express, Jul. 27, 2016, vol. 24, No. 16, 6 pages.

Pasayat, Shubra S et al., "Growth of strain-relaxed InGaN on micrometer-sized patterned compliant GaN pseudo-substrates", Applied Physics Letters, Mar. 16, 2020, vol. 116, No. 11, 6 pages.

* cited by examiner

RED LED AND METHOD OF MANUFACTURE

The present invention relates to a red LED, and an improved method of manufacturing a red LED.

BACKGROUND

III-V semiconductor materials are of particular interest for semiconductor device design, in particular the family of III-nitride semiconductor materials.

"III-V" semiconductors include binary, ternary and quaternary alloys of Group Ill elements, such as Ga, Al and In, with Group V elements, such as N, P, As and Sb), and are of great interest for a number of applications, including optoelectronics.

Of particular interest is the class of semiconductor materials known as "µl-nitride" materials, which includes gallium nitride (GaN), indium nitride (InN) and aluminium nitride (AlN), along with their ternary and quaternary alloys. (Al,In)GaN is a term encompassing AlGaN, InGaN and GaN. III-nitride materials have not only achieved commercial success in solid-state lighting and power electronics, but also exhibit particular advantages for quantum light sources and light-matter interaction.

Doping of In into GaN semiconductor material is of interest for optoelectronic semiconductor devices, as varying the In content of the semiconductor alters the electronic bandgap of the material, and therefore the wavelength at which the semiconductor emits light. However, varying the In content of the material also affects the in-plane lattice constant of the semiconductor. For example, the in-plane lattice constant of InN is roughly 11% larger than that of GaN, with the lattice dimensions of intermediate compositions varying depending on the indium content. This creates a problem in device design where it is desirable to deposit an active semiconductor layer on top of a substrate layer that has different lattice dimensions. The reason for this is that the lattice mismatch at the layer boundary introduces strain into the lattice which leads to the formation of defects in the material which act as non-radiative recombination centres. This significantly harms device performance.

There is a huge demand for red LEDs, but manufacturers have historically struggled to make LEDs emitting at red wavelengths.

One of the big challenges facing the growth of long wavelength LEDs such as red LEDs on GaN-based platforms, for example, is the requirement to use high indium (In) contents to reduce the bandgap in the active region to an appropriate level for long-wavelength emission. The required InGaN active regions have a larger lattice parameter than the underlying GaN and the resulting strain leads to the formation of defects in the material which act as non-radiative recombination centres deteriorating device performance.

High quality InGaN (with high Indium content>20%) is therefore difficult to achieve, due to the large lattice mismatch between InN and GaN. The misfit strain also results in a reduced indium composition through the composition pulling effect.

Shorter-wavelength LEDs such as green and yellow LEDs are much easier to manufacture, as they can be made using InGaN light emitting regions containing a lower proportion of Indium than is needed for red light emission.

Due to these problems, prior attempts to produce red wavelength LEDs on GaN platforms have not been successful.

SUMMARY OF INVENTION

The present application relates to an improved method of manufacturing semiconductor devices, in particular red LEDs, and to red LEDs made using that method.

The invention is defined in the independent claims, to which reference should now be made. Preferred or advantageous features of the invention are defined in the appended sub-claims.

The light-emitting diodes, or LEDs, described in the present application are preferably formed from III-V semiconductor material, particularly preferably from III-nitride semiconductor material.

"III-V" semiconductors include binary, ternary and quaternary alloys of Group Ill elements, such as Ga, Al and In, with Group V elements, such as N, P, As and Sb), and are of great interest for a number of applications, including optoelectronics.

Of particular interest is the class of semiconductor materials known as "III-nitride" materials, which includes gallium nitride (GaN), indium nitride (InN) and aluminium nitride (AlN), along with their ternary and quaternary alloys (Al,In)GaN. Different crystal orientations may be used in the present invention, such as polar c-plane, non-polar and semi-polar orientations. There are two primary non-polar orientations, a-plane (11-20) and m-plane (1-100). For semipolar, there are (11-22), {2021} which is a family of crystal planes. III-nitride materials have not only achieved commercial success in solid-state lighting and power electronics, but also exhibit particular advantages for quantum light sources and light-matter interaction.

While a variety of III-nitride materials are commercially interesting, Gallium nitride (GaN) is widely regarded as one of the most important new semiconductor materials, and is of particular interest for a number of applications.

It is known that the introduction of pores into bulk III-nitrides, such as GaN can profoundly affect its material properties (optical, mechanical, electrical, and thermal, etc.). The possibility of tuning a wide range of material properties of GaN and III-nitrides semiconductors by altering its porosity therefore makes porous GaN of great interest for optoelectronic applications.

The present invention will be described by reference to GaN and InGaN, but may advantageously be applicable to alternative III-nitride material combinations.

In the following description, a substrate for overgrowth is a semiconductor structure, on which a further semiconductor layer is to be grown in order to result in a semiconductor device. An exemplary substrate for overgrowth in the present invention may be a GaN semiconductor structure, comprising multiple layers of doped and undoped GaN.

Layers of the semiconductor structure may be porosified by electrochemical etching as set out in international patent applications PCT/GB2017/052895 (published as WO2019/063957) and PCT/GB2019/050213 (published as WO2019/145728).

The inventors have found that red LEDs can advantageously be provided using the present invention.

Semiconductor Structure

According to a first aspect of the invention there is provided a red-light emitting diode (LED), comprising:

an n-doped portion;

a p-doped portion; and a light emitting region located between the n-doped portion and a p-doped portion, the light emitting region comprising:
a light-emitting indium gallium nitride layer which emits light at a peak wavelength between 600 and 750 nm under electrical bias thereacross;
a III-nitride layer located on the light-emitting indium gallium nitride layer; and a III-nitride barrier layer located on the III-nitride layer,
wherein the light emitting diode comprises a porous region of III-nitride material.

The present inventors have realised that electrochemical porosification of III-nitride materials advantageously leads to a reduction in the strain in the III-nitride lattice, and the overall wafer bow or curvature. Without wishing to be bound by theory, it is thought that the process of porosifying the porous region of III-nitride material also etches away structural defects, such as threading dislocations which were formed during growth of that layer on top of the layer of first III-nitride material.

The removal of dislocations from the semiconductor material of the porous region during porosification greatly reduces the strain in the porous region, which occurs particularly if the lattice dimension of the porous region does not match the lattice dimension of the underlying material. Thus, during epitaxial growth of the semiconductor structure when layers of III-nitride material are deposited above the porous region, the porous material is more compliant to matching the lattice of the overlying non-porous layers. This results in the layers above the porous region experiencing significantly lower strain than would be the case without the porous region.

As the second III-nitride material experiences lower strain, there are also fewer structural defects in the non-porous layer to act as non-radiative recombination centres to harm device performance.

Composition pulling effect: Kawaguchi et al. reported a so-called InGaN composition pulling effect in which the indium fraction is smaller during the initial stages of growth but increases with increasing growth thickness. This observation was to a first extent independent of the underlying layer, GaN or AlGaN. The authors suggested that this effect is caused by strain caused by the lattice mismatch at the interface. They found that a larger lattice mismatch between InGaN and the bottom epitaxial layers was accompanied by a larger change in the In content.

In Theoretical study of the composition pulling effect in InGaN metalorganic vapor-phase epitaxy growth by Inatomi et al (Japanese Journal of Applied Physics, Volume 56, Number 7) it was found that compressive strain suppresses the incorporation of InN. On the other hand, tensile strain promotes the incorporation of InN compared to the relaxed bulk growth case.

The inventors have found that the use of a porous region in the semiconductor structure leads to "strain relaxation" which reduces strain in the layers of a semiconductor structure, and that this can lead to an improvement with respect to the composition pulling effect. Porosification reduces the strain in the III-nitride layers and the semiconductor structure is made less strained, and thus the conditions for higher incorporation of In are made available. The present invention can therefore aid in higher Indium incorporation into layers of the LED grown on top of the porous region, which is highly desirable for emission at longer wavelengths.

The n-doped region, the light emitting region, and the p-doped region are preferably provided above the porous region. In other words, the porous region may be positioned under the n-doped region, the light emitting region, and the p-doped region in the LED structure.

By providing a porous region of III-nitride material in the LED, the n-doped region, the light emitting region, and the p-doped region may therefore be grown over the porous region with a lower strain than would be possible without the porous region. This reduced level of strain in the layered semiconductor structure can therefore aid in higher Indium incorporation into the light emitting layer(s) of the LED, so that high quality InGaN light emitting layers can be grown with a high Indium content. This allows enough indium to be incorporated into the light-emitting indium gallium nitride layer so that the LED emits light at a peak wavelength between 600 and 750 nm when an electrical bias is applied across the LED.

As mentioned in the background section above, although there is a huge demand for red LEDs that emit light between 600 and 750 nm, the technical difficulties of incorporating enough indium into the light emitting layer(s) has meant red InGaN LEDs have been hard to achieve. Shorter-wavelength LEDs such as green (500-500 nm) and yellow (550-600 nm) LEDs, however, are much easier to manufacture, as they can be made using InGaN light emitting regions containing a lower proportion of Indium than is needed for red light emission.

The inventors have found that growing an LED structure over a porous region of III-nitride material causes a significant shift in emission wavelength towards longer wavelengths, compared to an identical LED structure grown on a non-porous substrate.

The inventors have demonstrated this by growing a conventional green/yellow (emission between 500-550 nm, or 550 nm-600 nm) InGaN LED structure on a non-porous GaN wafer, and demonstrating that the LED emits green/yellow light as expected. The same "green/yellow" InGaN LED structure was then grown on a template containing a porous region, and when an electrical bias was applied across the LED the LED emitted light in the red range of between 600 and 750 nm.

The present invention therefore allows conventional, easily-manufacturable LED structures to be shifted to longer wavelength emission, so structures previously used as yellow or green LEDs can be made into red LEDs by incorporating a porous region into the structure. This may advantageously allow red LEDs to be made without many of the technical problems experienced in prior art designs.

The LED light emitting region may be an LED light emitting region for emitting at a peak wavelength of 500-600 nm, or 500 nm-550 nm, or 550 nm-600 nm, or 510 to 570 nm, or 530 nm to 560 nm or 540 nm-600 nm. The LED light emitting region may be an LED light emitting region which emits at a peak wavelength of 500-600 nm, or 510 to 570 nm, or 530 nm to 560 nm or 540 nm-600 nm when not overgrown on a porous III-nitride layer. Growth of the LED light emitting region over the porous region of III-nitride material may however shift the emission wavelength of the light-emitting region to between 600 and 750 nm.

The light emitting region may emit light at a peak wavelength between 600 and 750 nm under electrical bias, or between 600 and 700 nm, or between 615 and 675 nm, or between 600 and 660 nm under electrical bias.

In an aspect of the present invention there may be provided a red-light emitting diode (LED), comprising:
an n-doped portion;
a p-doped portion; and a light emitting region between the n-doped portion and a p-doped portion, the light emitting region comprising a light-emitting indium gallium nitride layer for emitting at a peak wavelength of 500 nm-550 nm or 550 nm-600 nm, wherein the light emitting diode is positioned on a porous region of III-nitride material, and wherein the porous region of III-nitride material shifts the emission wavelength of the light-emitting region to a peak wavelength between 600 and 750 nm under electrical bias thereacross.

The red LED may comprise a yellow or green InGaN LED structure, grown over a porous region of III-nitride material.

The light emitting diode may comprise at least one feature selected from:

(a) the light emitting region comprises one or two or three or four or five or six or seven or eight quantum wells (or at least one quantum well); or (b) the III-nitride layer comprises an aluminum gallium nitride layer which has a composition $Al_yGa_{(1-y)}N$, where y is in a range from 0.1 to 1.0; or (c) a UV or blue emitting InGaN/GaN or InGaN/inGaN superlattice or InGaN layer is located between the n-doped portion and the light emitting region.

The porous region may have a thickness of at least 1 nm, preferably at least 10 nm, particularly preferably at least 50 nm. For example, the porous region may have a thickness between 1 nm and 10000 nm. The porous region may have a porosity between 1% and 99% porosity.

The porous region may be under or below the n-type region, the light emitting region and the p-type region of the LED. Preferably the n-type region, the light emitting region and the p-type region (the LED structure) is positioned on or over the porous region, as defined by the order of growth of the layers in the LED. The LED structure is preferably overgrown on the porous region, so that the LED structure benefits from the strain relaxation in the porous III-nitride layer.

The red LED may comprise a connecting layer of III-nitride material positioned between the n-doped portion and the porous region. Preferably the thickness of the connecting layer is at least 100 nm, though lesser or greater thicknesses could also be employed.

The red LED preferably comprises a non-porous intermediate layer of III-nitride material porous region between the porous region and the light emitting region. As the porous region is preferably formed by electrochemical porosification through a non-porous layer of III-nitride material, using the method of PCT/GB2017/052895 (published as WO2019/063957) and PCT/GB2019/050213 (published as WO2019/145728), the non-porous layer of III-nitride material typically forms a non-porous intermediate layer which remains on top of the porous region. The non-porous intermediate layer may advantageously provide a smooth surface for overgrowth of further layers during manufacture.

Preferably the LED comprises a non-porous intermediate layer of III-nitride material positioned between the porous region and the connecting layer. This may preferably be a non-porous layer through which electrochemical etching of the porous region takes place.

The porous region may be a porous layer, such that the light emitting diode comprises a porous layer of III-nitride material. Preferably the porous region may be a porous layer that is continuously porous, for example formed from a continuous layer of porous III-nitride material.

The porous region may comprise a plurality of porous layers, and optionally a plurality of non-porous layers. In preferred embodiments of the invention, the porous region is a stack of alternating porous and non-porous layers, with the top surface of the stack defining the top of the porous region, and the bottom surface of the stack defining the bottom of the porous region. The light emitting region may be formed over a porous region comprising a stack of porous layers of III-nitride material.

In some embodiments, the light emitting region is positioned over a stack of multiple porous layers of III-nitride material. Thus, rather than being a single porous layer of III-nitride material, the porous region may be a stack of layers of III-nitride material in which at least some layers are porous. The stack of porous layers may preferably be a stack of alternating porous and non-porous layers.

Alternatively the porous region may be a layer of III-nitride material that contains one or more porous regions, for example one or more porous regions in an otherwise non-porous layer of III-nitride material.

In preferred embodiments, the porous region, or porous layer, may have a lateral dimension (width or length) equivalent to that of the substrate on which the porous layer or region is grown. For example, conventional substrate wafer sizes may have a variety of sizes, such as 1 cm², or 2 inch, 4 inch, 6 inch, 8 inch, 12 inch, or 16 inch diameter. By patterning one or more layers and/or depositing regions of different charge carrier concentrations in the same layer, however, smaller porous regions can be formed that do not span the entire substrate. The lateral dimensions of the porous layer or region may therefore vary from around 1/10 of a pixel (for example 0.1 μm), up to the lateral dimensions of the substrate itself. The n-doped portion preferably comprises an n-doped III-nitride layer.

Preferably the n-doped portion and/or the n-doped layer comprises n-GaN, or n-InGaN, or a stack of alternating layers of n-GaN/n-InGaN, or a stack of alternating layers of n-InGaN/n-InGaN containing different concentrations of indium.

The n-doped portion may comprise a single-crystalline n-doped III-nitride portion, preferably in which the n-doped portion comprises a single-crystalline n-doped III-nitride layer having a planar top surface.

The porous region and each layer between the porous region and the single-crystalline n-doped III-nitride layer may be planar layers having a respective top surface and a respective bottom surface that are parallel to the planar top surface of the single-crystalline n-doped III-nitride layer.

The light-emitting indium gallium nitride layer preferably comprises one or more InGaN quantum wells, preferably between 1 and 7 quantum wells.

The light emitting indium gallium nitride layer may be a nanostructured layer of InGaN comprising quantum structures such as quantum dots, fragmented quantum well, or discontinuous quantum well.

The light-emitting indium gallium nitride layer and/or the quantum wells preferably have the composition $In_xGa_{1-x}N$, in which $0.15 \leq x \leq 0.40$, preferably $0.20 \leq x \leq 0.40$ or $0.26 \leq x \leq 0.40$, particularly preferably $0.30 \leq x \leq 0.40$.

The red-LED preferably comprises a III-nitride layer located on the light-emitting indium gallium nitride layer; and a III-nitride barrier layer located on the III-nitride layer.

The III-nitride layer on the light-emitting InGaN layer may be termed a "cap layer". This cap layer is used to 1) increase the quantum confined stark effect for band bending, hence the red shift and achieving red colour emission, and 2) to protect the high In % in InGaN to ensure sufficient In % is incorporated for achieving long wavelengths, as well as providing a larger barrier.

The LED preferably comprises a cap layer of III-nitride material between the quantum wells and the p-doped region. The cap layer could be GaN, InGaN, AlGaN, or AlN.

The LED preferably comprises a barrier layer of III-nitride material between the quantum wells and the p-doped region. The barrier layer could be GaN, InGaN, AlGaN, or AlN.

The p-doped region may comprise a p-doped III-nitride layer and a p-doped aluminium gallium nitride layer positioned between the p-doped III-nitride layer and the light emitting region. The p-doped aluminium nitride layer is preferably an electron-blocking-layer (EBL) positioned between the cap layer and the p-type layer, in which the electron-blocking-layer contains 5-25 at % aluminium, preferably in which the electron-blocking-layer has a thickness of between 10-50 nm.

The porous region is preferably not part of a distributed Bragg reflector (DBR).

Red Mini-LED

In a second aspect of the present invention there may be provided a red mini-LED, comprising the red LED according the first aspect of the invention, in which the light-emitting region has lateral dimensions (width and length) of greater than 100 μm and less than 200 μm.

Red Micro-LED

In a third aspect of the present invention there may be provided a red micro-LED, comprising the red LED according to the first aspect of the invention, in which the light-emitting region has lateral dimensions of less than 100 μm. The micro-LED may preferably have lateral dimensions of less than 80 μm, or 70 μm, or 60 μm, or 50 μm or 30 μm, or 25 μm, or 20 μm, or 15 μm or 10 μm, or 5 μm or 3 μm or 1 μm.

Micro-LED Array

In a fourth aspect of the present invention there may be provided a microLED array, comprising a plurality of red micro-LEDs according to the third aspect of the invention.

Method of Manufacture

In a fifth aspect of the present invention there may be provided a method of manufacturing a red LED, comprising the step of overgrowing, over a porous region of III-nitride material:

an n-doped portion;

a p-doped portion; and a light emitting region located between the n-doped portion and a p-doped portion, the light emitting region comprising a light-emitting indium gallium nitride layer which emits light at a peak wavelength between 600 and 750 nm under electrical bias thereacross.

The n-doped region, p-doped region and light emitting region may comprise a yellow or green InGaN LED structure, as described further below.

Alternatively, the method may comprise the step of growing a red LED structure over a porous region of III-nitride material, at a higher growth temperature than has previously been possible. As the presence of the porous region of III-nitride material means that the semiconductor lattice is strain-relaxed, a higher-than-usual growth temperature can be used to incorporate the required indium when growing the InGaN light emitting layer. The red LED structure overgrown on the porous region may be a known red LED structure, but in this case the use of the porous template advantageously allows the red LED light emitting layers, for example InGaN quantum wells (QWs) to be grown at a higher growth temperature than is possible when overgrowing on non-porous substrates.

In a sixth aspect of the present invention there may be provided a method of manufacturing a red LED, comprising the step of overgrowing, over a porous region of III-nitride material:

an n-doped portion;

a p-doped portion; and an LED light emitting region between the n-doped portion and a p-doped portion, the light emitting region comprising a light-emitting indium gallium nitride layer for emitting at a peak wavelength of 500 nm-550 nm or 550 nm-600 nm, wherein overgrowth on the porous region of III-nitride material shifts the emission wavelength of the light-emitting region to a peak wavelength between 600 and 750 nm under electrical bias.

The following discussion applies to the methods of both the fifth and sixth aspects of the invention.

The light emitting region may comprise a light-emitting indium gallium nitride layer for emitting at a peak wavelength of 500-550 nm, or 500-580 nm, or 510 to 570 nm, or 530 nm to 560 nm, or 550 nm to 600 nm. The light-emitting indium gallium nitride layer may be one or more layers known to emit at these wavelengths when grown in conventional LEDs, for example on non-porous GaN substrates. However, the inventors have found that growing conventional yellow or green LED structures over a porous III-nitride layer leads to an LED that emits at a peak wavelength between 600 and 750 nm under electrical bias.

The method may comprise the step of growing a yellow or green LED structure over a porous region of III-nitride material.

Overgrowth on the porous region of III-nitride material may lead to the light-emitting region emitting at a peak wavelength between 615 and 665 nm under electrical bias.

The following features are equally applicable to the methods of both the fifth and sixth aspects of the invention.

The method may comprise the first step of electrochemically porosifying a layer of III-nitride material, to form the porous region of III-nitride material. This may be achieved using a wafer scale porosification process as set out in international patent applications PCT/GB2017/052895 (published as WO2019/063957) and PCT/GB2019/050213 (published as WO2019/145728).

The method may preferably comprise the step of forming the porous region of III-nitride material by electrochemical porosification through a non-porous layer of III-nitride material, such that the non-porous layer of III-nitride material forms a non-porous intermediate layer. The non-porous intermediate layer may advantageously provide a smooth surface for overgrowth of further layers, such as one or more connecting layers of III-nitride material.

The porous region may be formed by porosifying one or more layers or regions of III-nitride material on a substrate. The substrate may be Silicon, Sapphire, SiC, β-Ga2O3. The crystal orientation of the substrates can be polar, semi-polar or non-polar orientation. The substrate thickness may typically vary between 100 μm and 1500 μm.

The porous region may be a porous layer, such that the method comprises the step of overgrowing, over a porous layer of III-nitride material: an n-doped portion; a p-doped portion; and an LED light emitting region. Preferably the porous region may be a porous layer that is continuously porous, for example formed from a continuous layer of porous III-nitride material.

The porous region may comprise a plurality of porous layers, and optionally a plurality of non-porous layers. In preferred embodiments of the invention, the porous region is a stack of alternating porous and non-porous layers, with the top surface of the stack defining the top of the porous region, and the bottom surface of the stack defining the bottom of the porous region.

Alternatively the porous region may be a layer of III-nitride material that contains one or more porous regions, for example one or more porous regions in an otherwise non-porous layer of III-nitride material.

In preferred embodiments, the porous region, or porous layer, may have a lateral dimension (width or length) equivalent to that of the substrate on which the porous layer or region is grown. For example, conventional substrate wafer sizes may have a variety of sizes, such as 1 cm², or 2 inch, 4 inch, 6 inch, 8 inch, 12 inch, or 16 inch diameter. By patterning one or more layers and/or depositing regions of different charge carrier concentrations in the same layer, however, smaller porous regions can be formed that do not span the entire substrate. The lateral dimensions of the porous layer or region may therefore vary from around $\frac{1}{10}$ of a pixel (for example 0.1 μm), up to the lateral dimensions of the substrate itself.

Prior to the porosification step, a doped region of n-doped III-nitride semiconductor material, preferably containing a layer, or stack of layers, may be deposited on a substrate. The III-nitride layer(s) may contain one or a combination of these elements: Al, Ga, In (ternary of quaternary layer). The thickness of the III-nitride stack is preferably between 10-4000 nm. The III-nitride region may have a doping concentration between $1 \times 10^{17}$ cm⁻³-$5 \times 10^{20}$ cm⁻³.

Preferably an intermediate layer of undoped III-nitride material is deposited over the doped material before it is porosified. The intermediate layer preferably has a thickness of between 1 nm and 3000 nm, preferably between 5 nm and 2000 nm. As the intermediate layer is undoped, it remains non-porous after the porosification step, which advantageously provides a good surface for epitaxial overgrowth of further layers of semiconductor.

In preferred embodiments, the doped region consists of an alternating stack of doped and undoped layers. In preferred embodiments the stack contains between 5-50 pairs of layers. The thickness of each highly doped layer may vary between 10 nm-200 nm and low-doped or undoped layers may have a thickness of between 5-180 nm.

As is known in the art, electrochemical porosification removes material from n-type doped regions of III-nitride materials, and creates empty pores in the semiconductor material.

In preferred embodiments, the red LED structure is formed over a stack of multiple porous layers of III-nitride material. Thus, rather than being a single porous layer of III-nitride material, the porous region may be a stack of layers of III-nitride material in which at least some layers are porous. The stack of porous layers may preferably be a stack of alternating porous and non-porous layers.

The method may preferably comprise the step of depositing one or more connecting layers of III-nitride material on the surface of the intermediate layer of III-nitride material prior to overgrowing the n-doped region, the LED light emitting region and the p-doped region on the connecting layer.

Alternatively, where there is no non-porous intermediate layer over the porous region, the method may comprise the step of depositing a connecting layer of III-nitride material onto the surface of the porous region of III-nitride material.

The method may comprise the further step of overgrowing the n-doped region, the LED light emitting region and the p-doped region on the connecting layer.

The red LED produced by the method of manufacture is preferably a red LED according to one of the first to fourth aspects of the invention.

Features described herein in relation to one aspect of the invention are equally applicable to the other aspects of the invention.

BRIEF DESCRIPTION OF THE DRAWINGS

Embodiments of the invention will now be described with reference to the figures, in which.

The porous template comprises a porous region of III-nitride material on a substrate, with a non-porous layer of III-nitride material arranged over the top surface of the porous region. Optionally there may be further layers of III-nitride material between the substrate and the porous region.

As described in more detail below, the porous region may be provided by epitaxially growing an n-doped region of III-nitride material and then an undoped layer of III-nitride material, and porosifying the n-doped region using the porosification process as set out in international patent applications PCT/GB2017/052895 (published as WO2019/063957) and PCT/GB2019/050213 (published as WO2019/145728).

As described above, this porosification leads to strain relaxation in the crystal lattice, which means that subsequent overgrowth of further semiconductor layers benefit from reduced compressive strain in their lattices.

The porous region may comprise one or more layers one or more III-nitride materials, and may have a range of thicknesses, all while still providing the strain relaxation benefit that shifts the wavelength of InGaN light emitting layers overgrown above the porous region. In preferred embodiments, the porous region may for example comprise GaN and/or InGaN.

Figure 1:
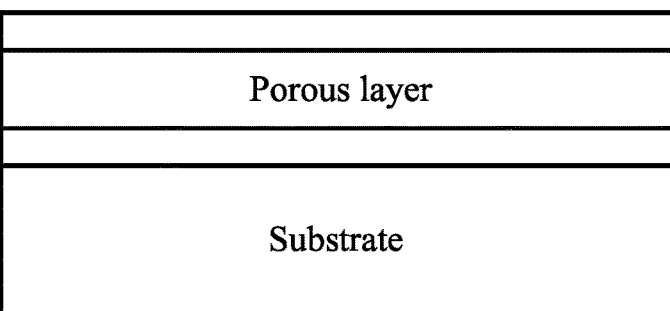
FIG. 1 illustrates a porous template suitable for a red LED according to the present invention.

A variety of LED structures may be overgrown over the template illustrated in FIG. 1.

In particular, LED structures containing InGaN light emitting layers, which are known in the art to be yellow or green LEDs, may be overgrown on the porous template using standard LED manufacturing steps. When grown on the porous template, however, a LED structure which normally emits at yellow or green wavelengths, will emit at red wavelengths of 600-750 nm.

In this way, the use of a porous region of III-nitride material as a template or pseudo-substrate for overgrowth of yellow or green InGaN LEDs allows red LEDs to be manufactured in a straightforward manner.

In a preferred embodiment, a red LED according to the present invention comprises the following layers, and may be manufactured using the step by step process described below.

The following description of the LED structure relates to a Top emission architecture being described from the bottom up, but the invention is equally applicable to a bottom emission architecture.

Figure 2:
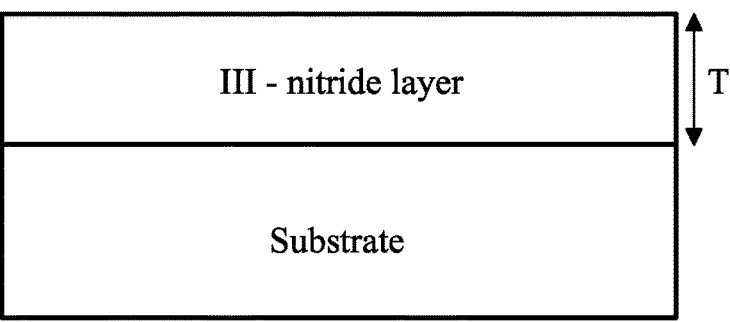
FIGS. 2-13 illustrate the steps of manufacturing a red LED according to a preferred embodiment of the present invention.

FIG. 2—Substrate & III-Nitride Layer for Porosification

A compatible substrate is used as a starting surface for epitaxy growth. The substrate may be Silicon, Sapphire, SiC, β-Ga2O3, GaN, glass or metal. The crystal orientation of the substrates can be polar, semi-polar or non-polar orientation. The substrate size may vary from 1 cm², 2 inch, 4 inch, 6 inch, 8 inch, 12 inch, 16 inch diameters and beyond, and the substrate may have a thickness of greater than 1 μm, for example between 1 μm and 15000 μm.

A layer or stack of layers of III-nitride material is epitaxially grown on the substrate. The III-nitride layer may contain one or a combination of these elements: Al, Ga, In (binary, ternary or quaternary layer).

The thickness T of the III-nitride stack is preferably at least 10 nm, or at least 50 nm, or at least 100 nm, for example between 10-10000 nm.

The III-nitride layer comprises a doped region having an n-type doping concentration between $1 \times 10^{17}$ cm$^{-3}$-$5 \times 10^{20}$ cm$^{-3}$. The III-nitride layer may also comprise an undoped "cap" layer of III-nitride material over the doped region.

The doped region may terminate at the exposed upper surface of the III-nitride layer, in which case the surface of the layer will be porosified during electrochemical etching.

Alternatively, the doped region of the III-nitride material may be covered by an undoped "cap" layer of III-nitride material, so that the doped region is sub-surface in the semiconductor structure. The sub-surface starting depth (d) of the doped region may be between 1-2000 nm for example.

Figure 3:
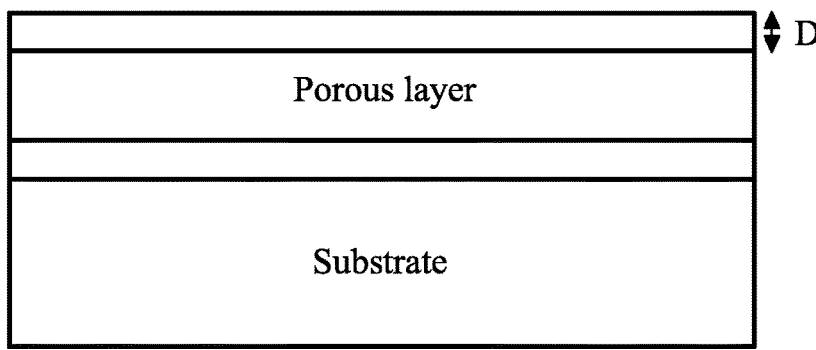

FIG. 3—Porosification to Porous Region

After it is deposited on the substrate, the III-nitride layer (or stack of layers) is porosified with a wafer scale porosification process as set out in international patent applications PCT/GB2017/052895 (published as WO2019/063957) and PCT/GB2019/050213 (published as WO2019/145728). During this process, the doped region of the III-nitride material becomes porous, while any undoped region of III-nitride material does not become porous.

Following the porosification step, the structure therefore contains a porous region which remains where there was previously n-doped III-nitride material, and optionally a non-porous intermediate layer overlying the porous region.

The degree of porosity of the porous region is controlled by the electrochemical etching process and may be between 1%-99% porosity, preferably between 20% to 90% porosity or between 30%-80%, though lesser or greater porosities could also be employed.

The thickness of the porous region following porosification is preferably greater than 1 nm, more preferably greater than 10 nm, particularly preferably at least 40 nm or 50 nm or 100 nm. However, the thickness of material required to obtain the strain relaxation benefit provided by the porous region may vary depending on the type of III-nitride material from which the porous region is made.

The porous region created by the porosification process may be a bulk layer of a III-nitride material having a uniform composition and a uniform porosity throughout the layer. Alternatively the porous region may comprise multiple layers of porous material of different compositions and/or porosities, forming a porous stack of III-nitride material. For example the porous region may be a continuous layer of porous GaN, or a continuous layer of porous InGaN, or a stack comprising one or more layers of porous GaN and/or one or more layers of porous InGaN. The inventors have found that the strain relaxation benefit of the porous region for overgrowth is obtainable across a wide range of porous regions having different thicknesses, compositions, and layered stacks.

In the embodiment illustrated in the Figures, the porous region is a single porous layer.

Where there is an undoped cap layer of III-nitride material over the doped region, the undoped region remains non-porous following through-surface porosification of the doped region below. The thickness D of this non-porous cap layer may preferably be at least 2 nm, or at least 5 nm, or at least 10 nm, preferably 5-3000 nm. Providing an undoped cap layer over the doped region advantageously leads to a non-porous layer of III-nitride material covering the porous region following porosification. This non-porous cap layer may advantageously allow better overgrowth of further material above the porous region.

As the porosification method of PCT/GB2017/052895 (published as WO2019/063957) and PCT/GB2019/050213 (published as WO2019/145728) can be carried out on entire semiconductor wafers, no processing/patterning/treatment is needed to prepare the template for porosification.

Figure 4:
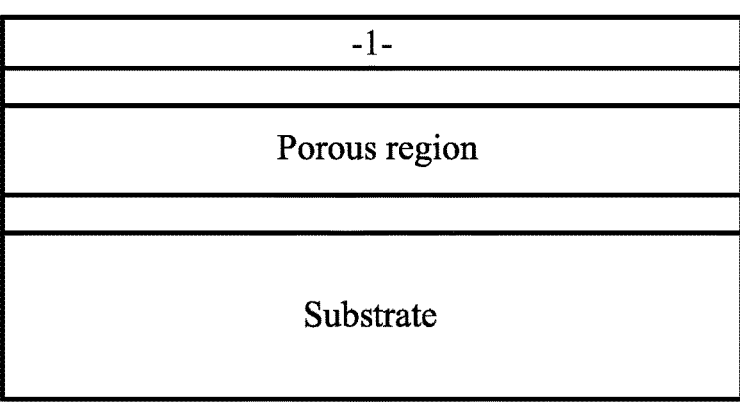

FIG. 4—Connecting Layer

After formation of the porous layer, a III-nitride LED epitaxy structure can be grown onto the porous template/pseudo-substrate provided by the porous layer and the non-porous cap layer.

The first layer for growth of the LED structure onto the template may be termed a connecting layer 1.

Although it is possible for an LED epitaxial structure to be grown directly onto the non-porous cap layer, it is preferable that a connecting layer 1 is provided over the cap layer before overgrowth of the LED structure. The inventors have found that the use of a III-nitride connecting layer 1 between the porous region and the LED epitaxy structure may advantageously ensure a good epitaxial relationship between the LED and the porous template/substrate. The growth of this layer makes sure that subsequent overgrowth on top of the connecting layer is smooth and epitaxial and suitably high quality.

The connecting layer 1 is formed of III-nitride material and may contain one or a combination of these elements: Al, Ga, In (binary, ternary or quaternary layer).

The connecting layer can be a doped or un-doped layer. The connecting layer can optionally be doped with suitable n-type dopant materials, e.g Si, Ge, C, O. The III-nitride layer may have a doping concentration between $1 \times 10^{17}$ cm$^{-3}$-$5 \times 10^{20}$ cm$^{-3}$.

The thickness of this connecting layer is preferably at least 100 nm, and can be for example between 100-10000 nm.

Figure 5:
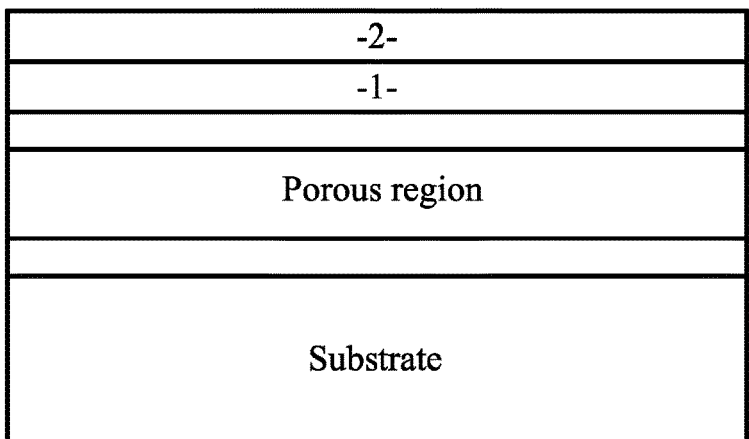

FIG. 5—N-Doped Region

After the growth of the connecting layer, a bulk n-doped III-nitride region 2 is grown.

The n-doped region 2 may comprise or consist of a III-nitride layer containing Indium, or a stack of thin III-nitride layers with or without indium, or a bulk layer or stack of III-nitride layers with a variation in atomic percentage of indium across the layer or stack is grown. For example, the n-doped region may be a layer of n-GaN, or a layer of n-InGaN, or alternatively the n-doped region may be a stack of n-GaN/n-InGaN alternating layers, or a stack of n-InGaN/n-InGaN alternating layers having different quantities of indium in alternating layers.

Preferably the n-doped region 2 comprises indium, so that the crystalline lattice of the n-doped region has similar lattice parameters to the lattice of the InGaN light emitting layer in the LED. The Indium atomic percentage in the n-doped region may vary between 0.1-25% for example.

In preferred embodiments, the indium content of the n-doped region is within 20 at %, or within 15 at %, or within 10 at %, or within 5 at % of the indium content of the InGaN light emitting layer. This may advantageously ensure that the lattice parameters of the n-doped region are sufficiently similar to those of the InGaN light emitting layer to avoid excessive strain between these layers.

The total thickness of the n-doped region may be at least 2 nm, or at least 5 nm, or at least 10 nm, or at least 20 nm. The thickness of the n-doped region may vary between 2 nm-5000 nm, or even thicker, for example. If the n-doped region comprises a stack of layers, the thickness of each individual layer in the stack is preferably between 1-40 nm.

The n-doped region preferably has an n-type doping concentration between $1 \times 10^{17}$ cm$^{-3}$-$5 \times 10^{20}$ cm$^{-3}$, preferably between $1 \times 10^{18}$ cm$^{-3}$-$5 \times 10^{20}$ cm$^{-3}$, particularly preferably greater than $1 \times 10^{18}$ cm$^{-3}$.

Figure 6:
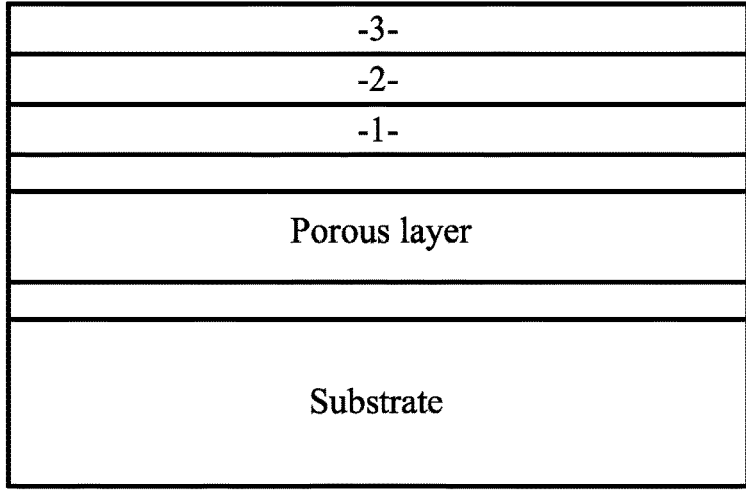

FIG. 6—Light Emitting Region

After growth of the n-doped region 2, an underlay or pre-layer or pre-well (not labelled in FIG. 6) may be grown, in order to release the strain in the light emitting layer(s). The underlay can be a single layer or stack/multi-layers of GaN, InGaN, or GaN/InGaN, or InGaN/InGaN. Alternatively, the underlay may have a structure similar to InGaN QW/GaN quantum barrier but with a lower proportion of indium. For example, before depositing the light emitting layer having a relatively high proportion of indium, an underlay consisting of a layer of bulk InGaN having a lower proportion of indium than the light emitting layer may be grown. Alternatively, the underlay may take the form of an InGaN "dummy" QW with a lower proportion of indium than the light emitting layer, and one or more GaN quantum barriers.

After Growth of the n-Doped Region 2 and Optionally the Underlay, a Light Emitting Region 3 Containing an InGaN Light Emitting Layer is Grown.

The light emitting region 3 may contain at least one InGaN light emitting layer. Each InGaN light emitting layer may be an InGaN quantum well (QW). Preferably the light emitting region may comprise between 1-7 quantum wells. Adjacent quantum wells are separated by barrier layers of III-nitride material having a different composition to the quantum wells.

The light emitting layer(s) may be referred to as "quantum wells" throughout the present document, but may take a variety of forms. For example, the light emitting layers may be continuous layers of InGaN, or the layers may be continuous, fragmented, broken layers, contain gaps, or nanostructured so that the quantum well effectively contains a plurality of 3D nanostructures behaving as quantum dots.

The quantum wells and barriers are grown in a temperature range of 600-800° C.

Each quantum wells consists of an InGaN layer with atomic indium percentage between 15-40%. Preferably the light-emitting indium gallium nitride layer(s) and/or the quantum wells have the composition In$_x$Ga$_{1-x}$N, in which $0.15 \leq x \leq 0.40$, preferably $0.20 \leq x \leq 0.40$ or $0.26 \leq x \leq 0.40$, particularly preferably $0.30 \leq x \leq 0.40$.

The thickness of each quantum well layer may be between 1.5-8 nm, preferably between 1.5 nm and 6 nm, or between 1.5 nm and 4 nm.

The quantum wells may be capped with a thin (0.5-3 nm) III-nitride QW capping layer, which may contain one or a combination of these elements: Al, Ga, In (ternary of quaternary layer)

The QW capping layer, which is the layer added immediately after QW growth, can be AlN, AlGaN of any A % 0.01-99.9%, GaN, InGaN of any In % 0.01-30%.

The III-nitride QW barriers separating the light emitting layers (quantum wells) may contain one or a combination of these elements: Al, Ga, In (ternary of quaternary layer). The QW barrier can be AlN, AlGaN of any A % 0.01-99.9%, GaN and InGaN of any In % 0.01-15%. Preferably the QW barrier layers contain AlN and/or AlGaN.

The QW capping layer(s) and QW barriers are not indicated with individual reference numerals in the Figures, as these layers form part of the light emitting region 3.

The QW capping layers may be grown after each QW but before the barrier growth. For example, if an LED contains 3 QWs then each of these QWs may be overgrown with a QW capping layer and then a QW barrier layer, so that the light emitting region contains 3 such QW capping layers and three such QW barrier layers.

1. One can grow the cap at the same conditions as the QW.
2. One can ramp without growth to higher temperature, and grow this cap (effectively this is an annealing step) and here the ramp can be carried out in a different gas mixture.
3. One can ramp and grow during the temperature ramp.

For the manufacture of red LEDs the large amount of Indium in the light emitting layer(s) makes the capping layer even more important, as previous attempts to manufacture red LEDs have failed due to not enough Indium being incorporated. So capping is very important to make sure that there is sufficient Indium trapped within the light emitting region.

FIG. 7—Cap Layer

After growth of the light emitting layer(s) a non-doped cap layer 4 is grown. Non-doped cap layer 4 may be termed a light-emitting-region cap layer, as this layer is formed after growth of the complete light emitting region, for example after the growth of the stack of QWs, QW capping layers and QW barrier layers.

The cap layer (light-emitting-region cap layer) 4 is a standard layer which is very well known in the growth schemes for III-nitride LEDs.

The thickness of the cap layer can be between 5-30 nm, preferably between 5-25 nm or 5-20 nm.

The purpose of the light-emitting-region cap layer 4, is to protect the indium in the light emitting region (QW stack) and prevent it from desorbing/evaporating during subsequent processing. Because the InGaN QW is normally grown at lower temperature, that is not favourable for GaN/AlGaN, there is typically a temperature ramp step needed before further layers can be overgrown above the light emitting region. The cap layer is used to ensure that the InGaN light emitting layer(s) are properly capped and protected, so that there is a chance and time window to change the p-doped layer growth conditions for better material quality. The light-emitting-region cap layer 4 also ensures that no Mg dopant is entering the QW region during the growth of p-type layers.

Electron Blocking Layer (EBL)

After the growth of quantum wells, capping and barrier layers, an electron blocking III-nitride layer (EBL) 5 containing Aluminium is grown. The Al % can be between 5-25% for example, though higher Al content is possible.

The EBL is doped with a suitable p-type doping material. The p-type doping concentration of the EBL is preferably between $5 \times 10^{18}$ cm$^{-3}$-$8 \times 10^{20}$ cm$^{-3}$ The thickness of the EBL can be between 10-50 nm, preferably 20 nm.

Figures 7, 8:
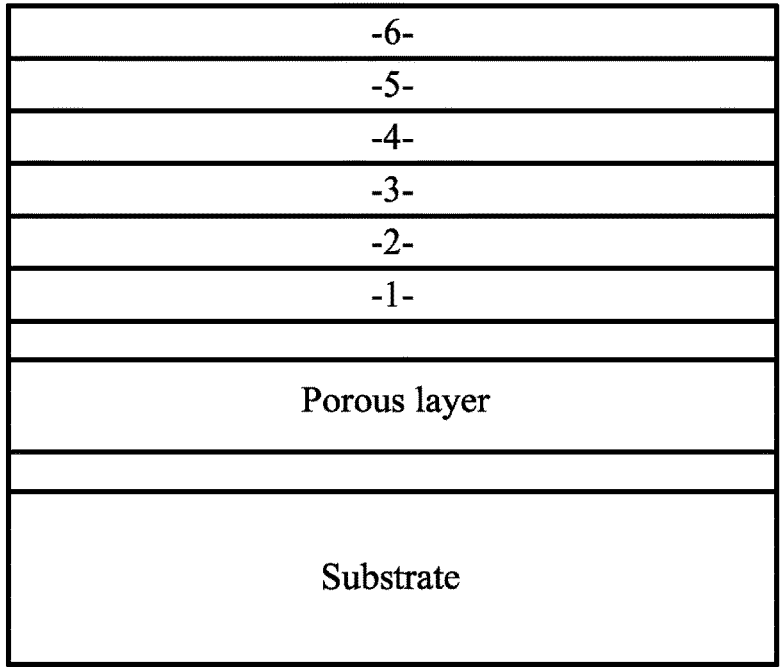

FIG. 8—P-Doped Layer

A p-doped layer 6 is grown above the electron blocking layer (EBL) 5.

The p-type region is preferably doped with Mg, and the p-type doping concentration of the p-type layer is preferably between $5 \times 10^{18}$ cm$^{-3}$-$8 \times 10^{20}$ cm$^{-3}$.

The p-doped III-nitride layer may contain In and Ga.

The doping layer is preferably between 20-200 nm thick, particularly preferably between 50-100 nm thick. The doping concentration may vary across the p-type layer and can have a spike in doping levels in the last 10-30 nm of the layer towards the LED surface, in order to allow better p-contact.

For activation of Mg acceptors in the p-doped layer, the structure may be annealed inside of MOCVD reactor or in an annealing oven. The annealing temperature may be in the range of 700-850° C. in N$_2$ or in N$_2$/O$_2$ ambient.

As both the EBL and the p-doped layer are p-type doped, these layers may be referred to as the p-doped region.

Figure 9:
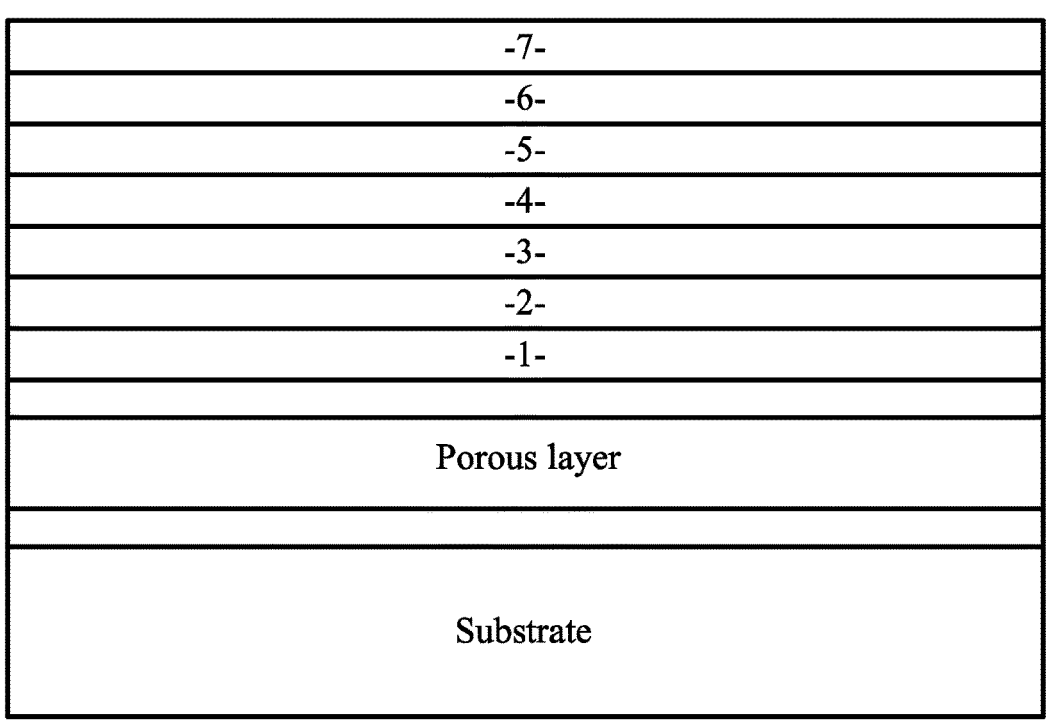

FIG. 9—Transparent Conducting Layer

The stack of active semiconductor layers is covered with a transparent conducting layer 7. The transparent conducting layer can be made of Ni/Au, indium tin oxide, indium zinc oxide, graphene, Pd, Rh, silver, ZnO etc., or a combination of these materials.

The thickness of the transparent conducting layer can be between 10-250 nm.

Transparent conducting layers are well known in the art, and any suitable material and thickness may be used.

An annealing step may be required for making the p-contact ohmic.

FIG. 10

Depending on the LED structure being manufactured, the semiconductor structure may be processed into LED, mini-LED or micro-LED devices.

Normal LEDs are typically larger than 200 μm (referring to the lateral dimensions of width and length of the LED structure. Mini-LEDs are typically 100-200 μm in lateral size, while Micro-LEDs are typically less than 100 μm in size.

Figure 10:
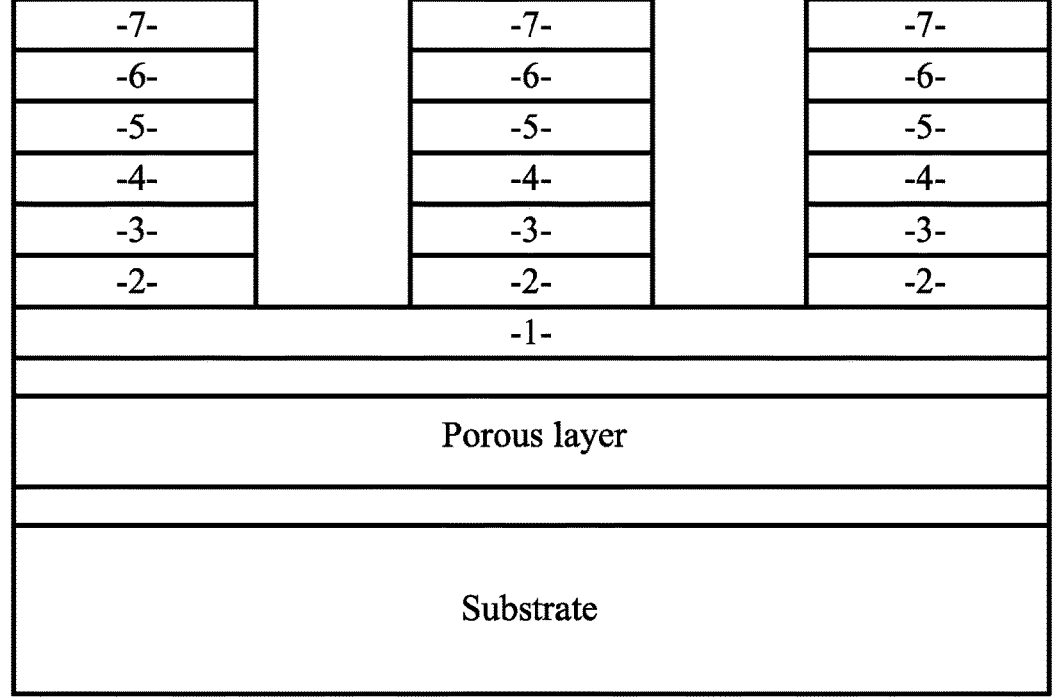

FIG. 10 onwards illustrates the semiconductor structure following etching of layers 2-7 of the semiconductor structure into multiple discrete LED stacks, or mesas, each having the same structure.

In the next step, the transparent conducting layer 7 is structured in such a way that it covers only the top surface of the active emission element. The structuring can be done using standard semiconductor processing methods that included resist coating and photolithography. The transparent conducting layer is etched by using wet chemistry or a sputter etch process using Argon. This step is followed by wet or dry etching of the III-nitride structure. An inductively couple plasma reactive ion etching, only reactive ion etching or neutral beam etching is used to create mesas in the III-nitride layer. The dry etch process may include either one or more of Cl, Ar, BCl$_3$, SiCl$_4$ gases.

The purpose of this step is to isolate the individual emitting elements and access the buried n-doped layer of the p-n junction.

After the dry etch process a wet etch process is done to remove the dry etching damage from the sidewalls of the mesa. The wet chemistry may involve KOH (1-20%), TMAH or other base chemistries.

Figure 11:
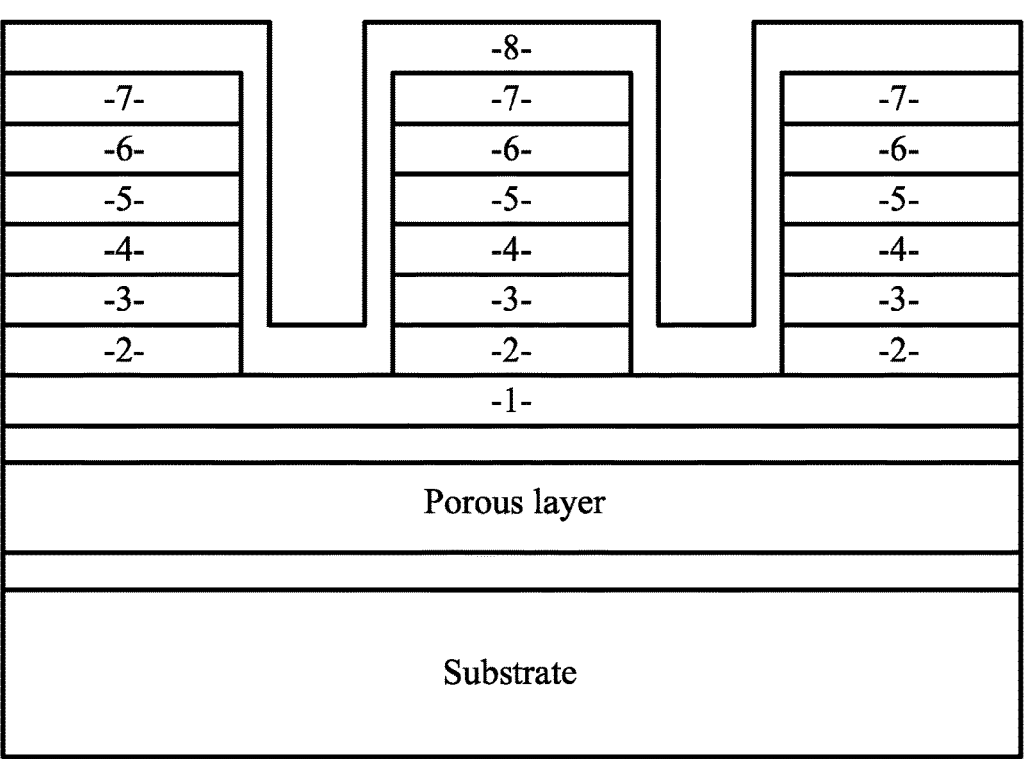
Figure 12:
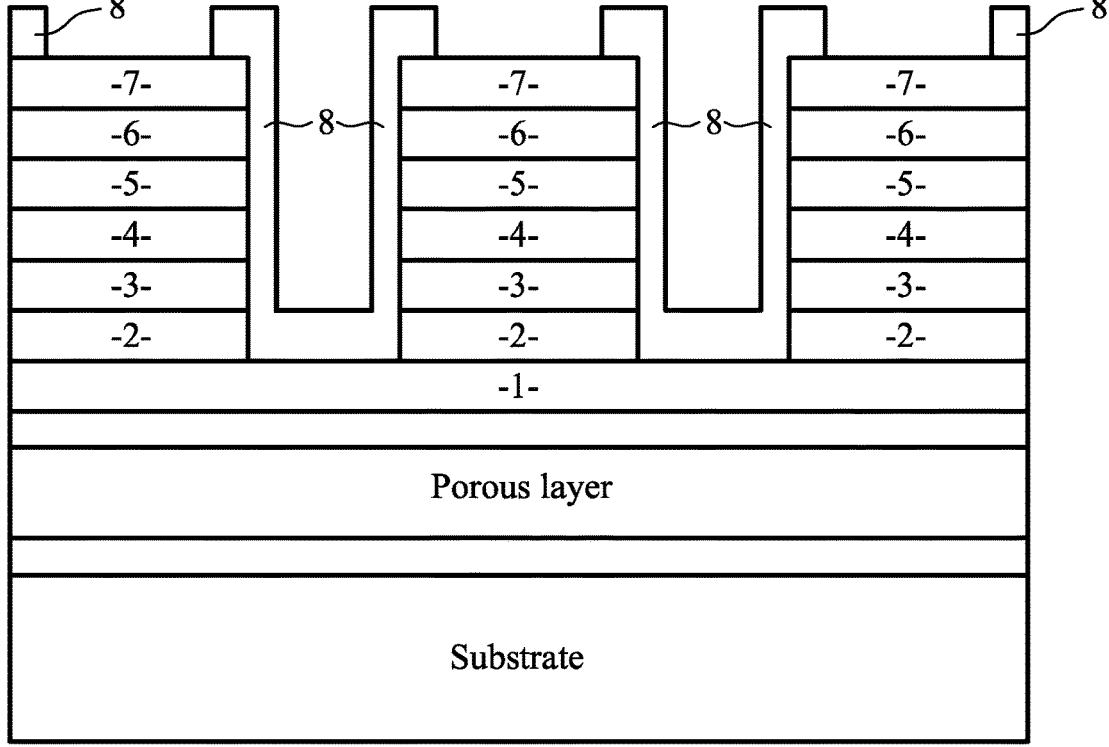
Figure 13:
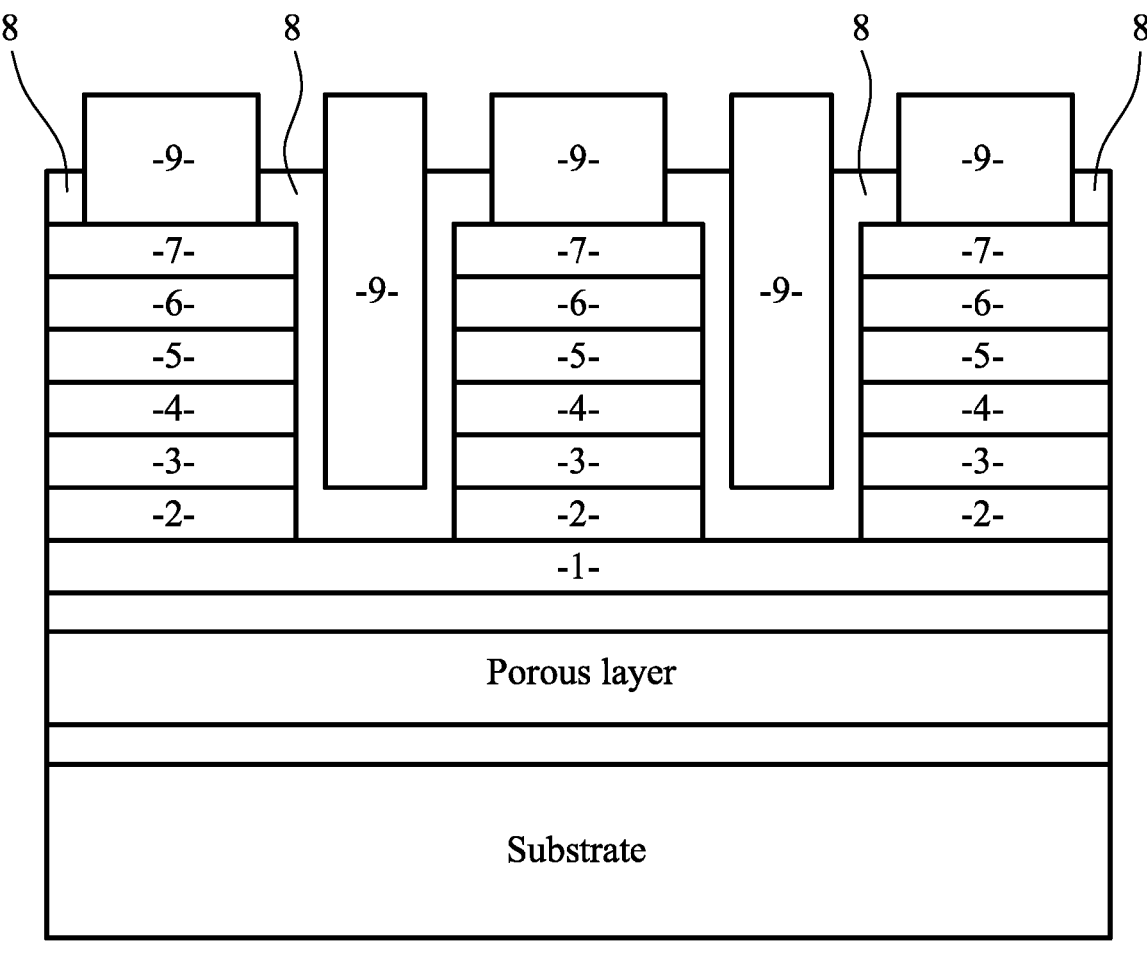

FIG. 11—Passivation

The next step is to deposit a passivation layer 8 or a combination of passivation layers. The starting passivation layer can be Al2O3 (10-100 nm) (deposited by atomic layer depositions) followed by sputtered or plasma enhanced chemical vapor deposited SiO2, SiN or SiON (50-300 nm).

The Al2O3 can be deposited between 50-150° C.

The SiO2, SiN and SiON can be deposited between 250-350° C.

The sputter process can be done at room temperature.

FIG. 12

The next step is to create openings in the oxide passivation layer 8 to expose the p- and n-GaN. This can be done via wet or dry etching or a combination of both.

For wet etching buffered oxide etch, diluted hydrofluoric acid phosphoric acid or a mixture of these can be used.

FIG. 13

The final step in the device fabrication is to cover the openings in the oxide with metal layers 9. The covering can be done with a single step or multiple steps. In this example a single step is used to simplify the details.

The metal may contain Ti, Pt, Pd, Rh, Ni, Au. The thickness of the complete metal stack can be between 200-2000 nm.

And after all processing, the substrate can be thinned, and/or the porous region can be removed so that the connecting layer 1 is exposed.

Surface structuring or texturing can be done on the substrate, at the porous region, or layer 1 to enhance the light output and control the emission angle, as well as other optical engineering and design.

Finally, the wafer/devices can be flipped, and bonded to another carrier substrate either can be silicon/sapphire or any type as passive devices, alternatively, the devices can be bonded to a CMOS silicon backplane for active matrix micro-LED display panel.

FIGS. 14-18

Figure 14:
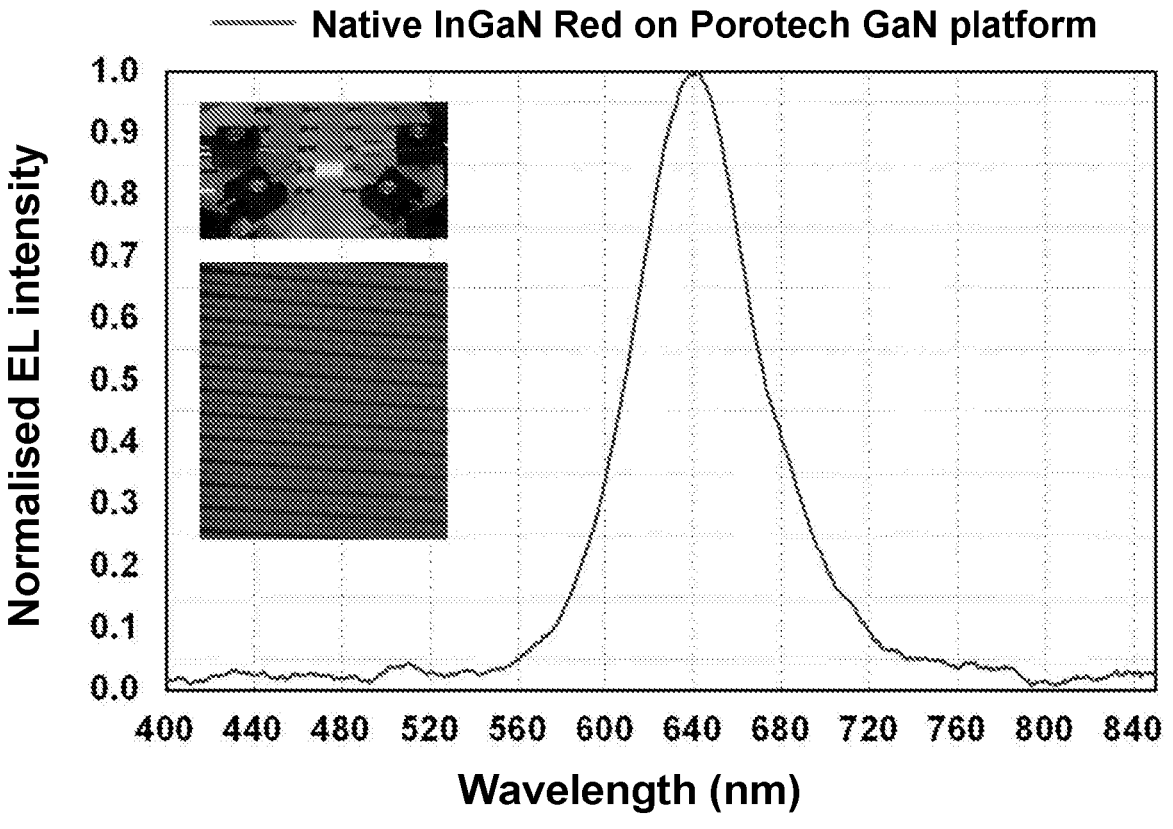
FIG. 14 is a graph of normalised electroluminescence (EL) intensity vs wavelength, for an InGaN LED over a porous region according to a preferred embodiment of the present invention.

FIG. 14 shows that an InGaN LED over a porous layer according to a preferred embodiment of the present invention emits at a peak wavelength of around 625 nm.

Figure 15:
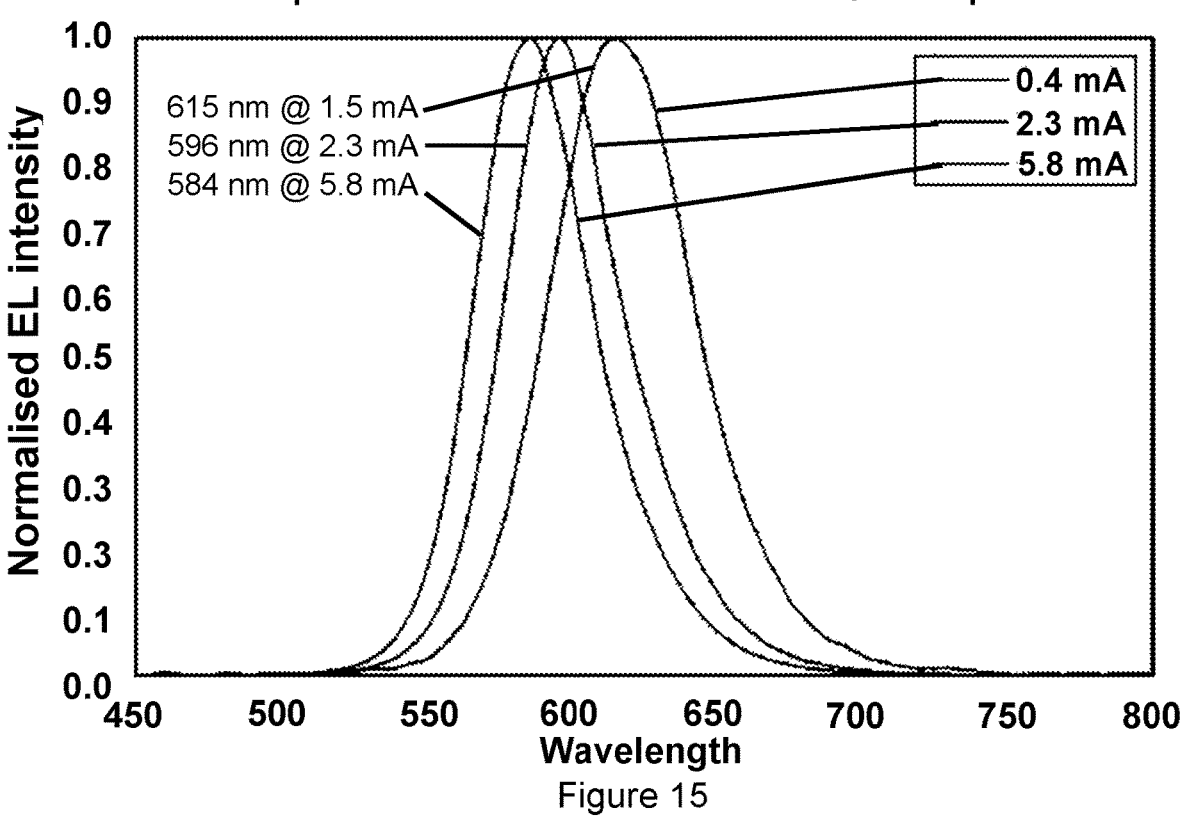
FIG. 15 is a graph of normalised electroluminescence (EL) intensity vs wavelength at different current injections, for an InGaN LED on a non-porous substrate.
Figure 16:
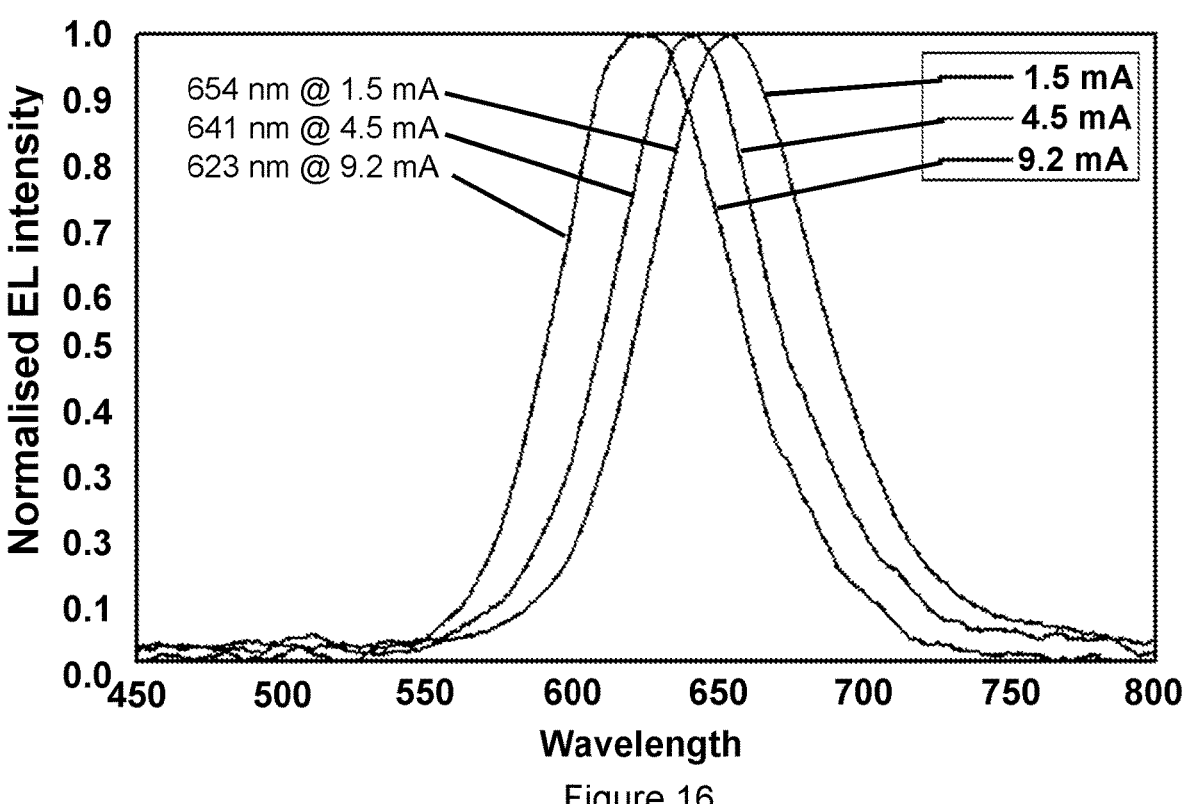
FIG. 16 is a graph of normalised electroluminescence (EL) intensity vs wavelength at different current injections, for the same InGaN LED as FIG. 15 grown over a porous region according to a preferred embodiment of the present invention.

FIGS. 15 and 16 compare the emission characteristics of an InGaN LED on a non-porous substrate (FIG. 15) and the same InGaN LED grown on a template comprising a porous layer of III-nitride material. Comparison of these two graphs demonstrates the shift towards longer emission wavelengths caused by the porous underlayer, as the emission of the LED on the porous template is consistently between 21 nm and 45 nm longer than that of the same LED on the non-porous template.

Figure 17:
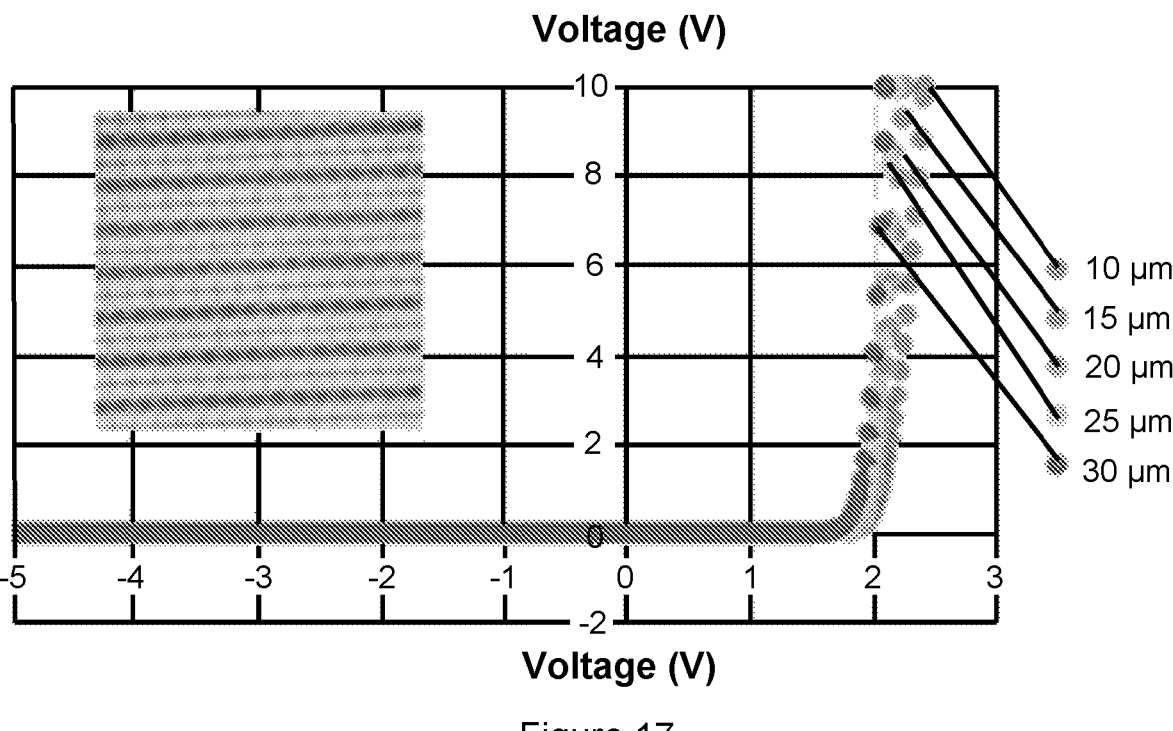
FIG. 17 is an I-V curve measured for InGaN micro-LEDs of different pixel sizes on a non-porous substrate, with the inset image showing yellow emission.
Figure 18:
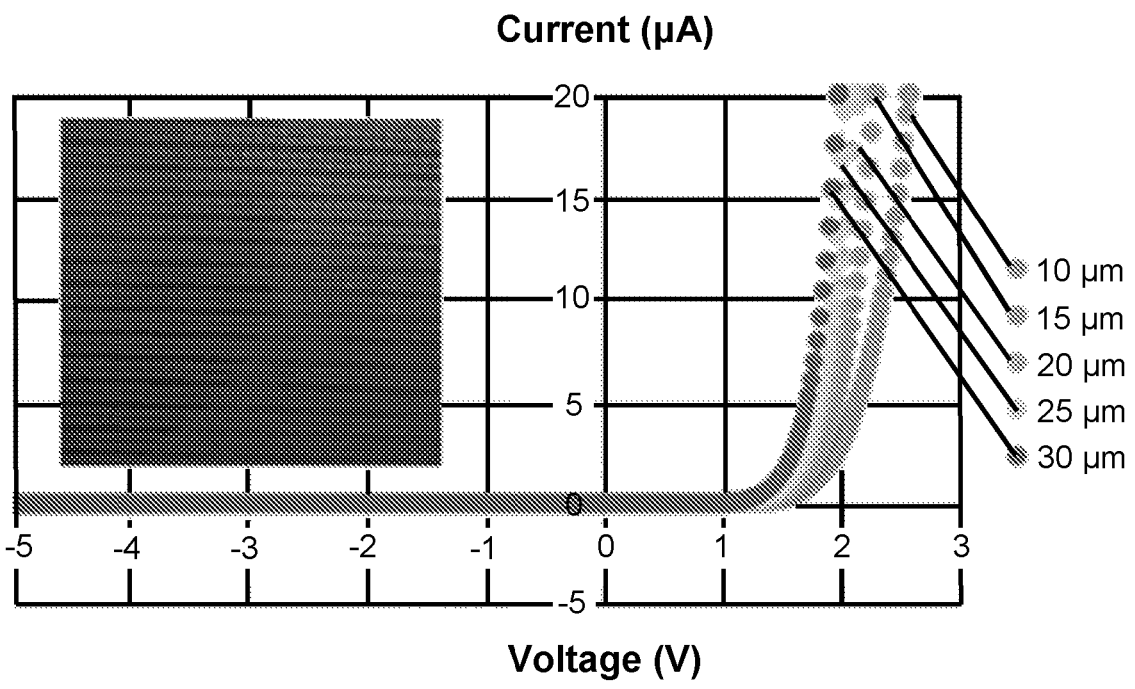
FIG. 18 is an I-V curve measured for InGaN micro-LEDs of different pixel sizes on a porous substrate, with the inset image showing red emission.

FIGS. 17 and 18 compare the I-V characteristics of InGaN micro-LEDs on a non-porous substrate (FIG. 17) with InGaN micro-LEDs on a template containing a porous layer.

The invention claimed is:

1. A red-light emitting diode (LED), comprising:

an n-doped portion;

a p-doped portion; and a light emitting region located between the n-doped portion and a p-doped portion, the light emitting region comprising:

a light-emitting indium gallium nitride layer which emits light at a peak wavelength between 600 and 750 nm under electrical bias thereacross;

a III-nitride layer located on the light-emitting indium gallium nitride layer; and a III-nitride barrier layer located on the III-nitride layer, wherein the light emitting diode comprises a porous region of III-nitride material.

2. A red LED according to claim 1, wherein the light emitting diode comprises at least one feature selected from:

(a) the light emitting region comprises one or two or three or four or five or six or seven or eight quantum wells (or at least one quantum well); or (b) the III-nitride layer comprises an aluminum gallium nitride layer which has a composition $Al_yGa_{(1-y)}N$, where y is in a range from 0.1 to 1.0; or (c) a UV or blue emitting InGaN/GaN or InGaN/inGaN superlattice or InGaN layer is located between the n-doped portion and the light emitting region.

3. A red LED according to claim 1, in which the light emitting region emits light at a peak wavelength between 600 and 700 nm, or between 615 and 675 nm under electrical bias.

4. A red LED according to claim 1, in which the LED light emitting region is an LED light emitting region for emitting at a peak wavelength of 500-580 nm, and in which the porous region of III-nitride material shifts the emission wavelength of the light-emitting region to between 600 and 750 nm.

5. A red LED according to claim 1, in which the porous region has a thickness of at least 10 nm.

6. A red LED according to claim 5, in which the red LED comprises a connecting layer of III-nitride material positioned between the n-doped portion and the porous region, optionally comprising a non-porous intermediate layer of III-nitride material positioned between the porous region and the connecting layer.

7. A red LED according to claim 5, in which the n-doped portion comprises an n-doped III-nitride layer, optionally in which the n-doped portion comprises n-GaN, or n-InGaN, or a stack of alternating layers of n-GaN/n-InGaN, or a stack of alternating layers of n-InGaN/n-InGaN containing different concentrations of indium.

8. A red LED according to claim 7, in which the n-doped portion comprises a single-crystalline n-doped III-nitride portion, optionally in which the porous region and each layer between the porous region and the single-crystalline n-doped III-nitride layer are planar layers having a respective top surface and a respective bottom surface that are parallel to the planar top surface of the single-crystalline n-doped III-nitride layer.

9. A red LED according to claim 1, in which the light-emitting indium gallium nitride layer comprises one or more InGaN quantum wells, optionally in which the light emitting indium gallium nitride layer is a nanostructured layer of InGaN comprising quantum structures such as quantum dots, fragmented or discontinuous quantum wells.

10. A red LED according to claim 9, in which a light-emitting indium gallium nitride layer and/or the quantum wells have the composition $In_xGa_{1-x}N$, in which $0.15 \leq x \leq 0.40$.

11. A red LED according to claim 1, in which the porous region is not part of a distributed Bragg reflector (DBR).

12. A red mini-LED, comprising the red LED according to claim 1, in which the light-emitting region has lateral dimensions of greater than 100 μm and less than 200 μm.

13. A red micro-LED, comprising the red LED according to claim 1, in which the light-emitting region has lateral dimensions of less than 100 μm.

14. A microLED array, comprising a plurality of red micro-LEDs according to claim 13.

15. A method of manufacturing a red LED, comprising the step of overgrowing, over a porous region of III-nitride material:

an n-doped portion;

a p-doped portion; and a light emitting region located between the n-doped portion and a p-doped portion, the light emitting region comprising a light-emitting indium gallium nitride layer which emits light at a peak wavelength between 600 and 750 nm under electrical bias thereacross.

16. A method of manufacturing a red LED, comprising the step of overgrowing, over a porous region of III-nitride material:

an n-doped portion;

a p-doped portion; and an LED light emitting region between the n-doped portion and a p-doped portion, the light emitting region comprising a light-emitting indium gallium nitride layer for emitting at a peak wavelength of 500-550 nm or 550 nm-600 nm, wherein overgrowth on the porous region of III-nitride material shifts the emission wavelength of the light-emitting region to a peak wavelength between 600 and 750 nm under electrical bias.

17. A method according to claim 15, comprising the first step of electrochemically porosifying a layer of III-nitride material, to form the porous region of III-nitride material.

18. A method according to claim 17, comprising the step of depositing a connecting layer of III-nitride material onto the surface of the porous region of III-nitride material; or comprising the step of forming the porous region of III-nitride material by electrochemical porosification through a non-porous region of III-nitride material, such that the non-porous region of III-nitride material forms a non-porous intermediate layer, and optionally further comprising the step of depositing one or more connecting layers of III-nitride material on the surface of the intermediate layer of III-nitride material prior to overgrowing the n-doped region, the LED light emitting region and the p-doped region with In % on the connecting layer.

19. A method according to claim 18, comprising the step of overgrowing the n-doped region, the LED light emitting region and the p-doped region on the connecting layer.

20. A method according to claim 16, in which the red LED comprises:

an n-doped portion;

a p-doped portion; and a light emitting region located between the n-doped portion and a p-doped portion, the light emitting region comprising:

a light-emitting indium gallium nitride layer which emits light at a peak wavelength between 600 and 750 nm under electrical bias thereacross;

a III-nitride layer located on the light-emitting indium gallium nitride layer; and a III-nitride barrier layer located on the III-nitride layer, wherein the light emitting diode comprises a porous region of III-nitride material.

* * * * *